(12) United States Patent
Ohsaki

(10) Patent No.: US 6,278,514 B1
(45) Date of Patent: Aug. 21, 2001

(54) EXPOSURE APPARATUS

(75) Inventor: Yoshinori Ohsaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/472,994

(22) Filed: Dec. 28, 1999

(30) Foreign Application Priority Data

Dec. 28, 1998 (JP) .................................................. 10-373706

(51) Int. Cl.[7] ........................... G03B 27/42; G03B 27/52; G03B 27/54
(52) U.S. Cl. .................................. 355/55; 355/53; 355/67
(58) Field of Search ................................... 355/55, 56, 45, 355/52, 18, 53, 30, 63, 77; 359/432, 821; 356/399–401; 250/548

(56) References Cited

U.S. PATENT DOCUMENTS

| | | | |
|---|---|---|---|
| 4,701,606 | * 10/1987 | Tanimoto et al. | 250/201 |
| 4,952,815 | * 8/1990 | Nishi | 250/548 |
| 5,120,128 | * 6/1992 | Ulich et al. | 356/121 |
| 5,286,963 | * 2/1994 | Torigoe | 250/201.2 |
| 5,418,598 | * 5/1995 | Fukuda et al. | 355/66 |
| 5,715,039 | * 2/1998 | Fukuda et al. | 355/53 |
| 5,793,473 | * 8/1998 | Koyama et al. | 355/55 |
| 5,793,735 | * 8/1998 | Oono | 369/116 |
| 5,805,273 | * 9/1998 | Unno | 355/30 |
| 5,898,501 | * 4/1999 | Suzuki et al. | 356/359 |
| 6,025,955 | * 2/2000 | Hiraiwa et al. | 359/355 |

FOREIGN PATENT DOCUMENTS

| | | |
|---|---|---|
| 0 851 304 | 1/1998 | (EP) . |
| 10-242048 | 9/1998 | (JP) . |
| 10-284368 | 10/1998 | (JP) . |

OTHER PUBLICATIONS

Von Bunau, et al. "Phase Retrieval From Defocused Images and its Applications in Lithography," Japanese Journal of Applied Physics, vol. 36, No. 12B, December 1997, pp. 7494–7498.

* cited by examiner

Primary Examiner—Russell Adams
Assistant Examiner—Hung Henry Nguyen
(74) Attorney, Agent, or Firm—Fitzpatrick, Cella, Harper & Scinto

(57) ABSTRACT

An exposure apparatus includes a stage on which a substrate to be exposed is provided, a projection optical system for projecting a pattern onto the substrate and an aberration detection system for forming an image of a pattern of a mask formed by light passed through the projection optical system plural times, for detecting an intensity distribution of the image of the pattern of the mask, and for detecting a wavefront aberration of the projection optical system on the basis of the detected intensity distribution.

16 Claims, 8 Drawing Sheets

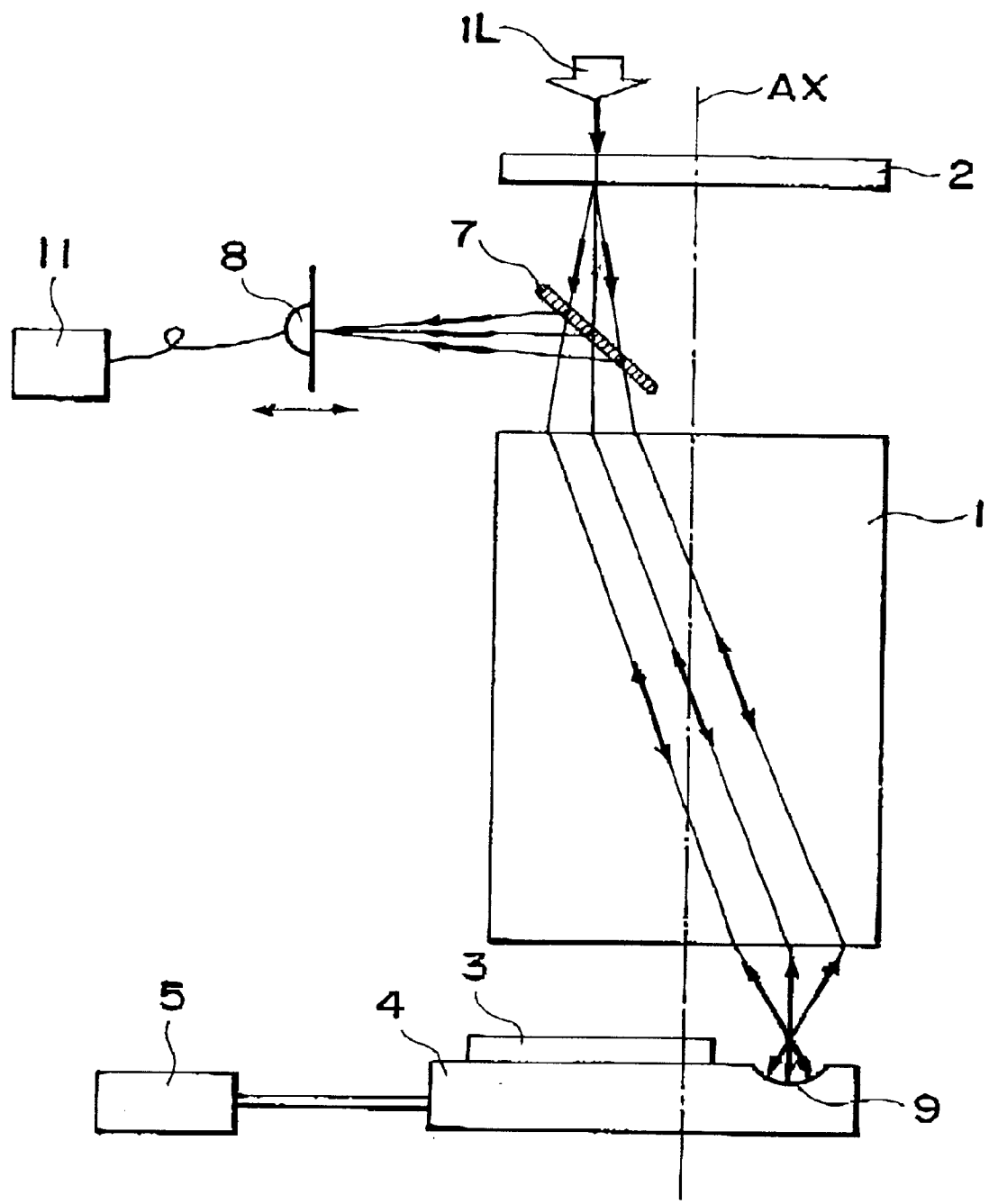
F I G. 2

EXPOSURE APPARATUS

FIELD OF THE INVENTION AND RELATED ART

This invention relates to an exposure apparatus for projecting a pattern, formed on a reticle or a photomask, for example, onto a photosensitive substrate, for example, through a projection optical system.

Exposure apparatuses such as described above are used in a lithographic process for the manufacture of semiconductor devices, for example. More specifically, they are used in a procedure for transferring, through a projection lens, an image of a circuit pattern, for example, formed on a reticle or a photomask (hereinafter, simply a "mask"), onto a semiconductor wafer, for example, having a photosensitive material coating thereon.

In such exposure apparatuses, it is required that a pattern on a mask is accurately transferred onto a wafer with a predetermined magnification (reduction scale). In order to meet this requirement, it is important to use a projection lens of good imaging performance, with reduced aberration. Particularly, because of recent needs for further miniaturization of a semiconductor device, in many cases, a pattern beyond an ordinary imaging performance of an optical system has to be transferred (printed). As a result of it, a pattern to be transferred becomes more sensitive to aberration of an optical system.

On the other hand, it has been required for a projection lens to enlarge its exposure area and numerical aperture (NA). This makes the aberration correction more difficult to attain.

In these situations, it is strongly desired to measure the imaging performance of a projection lens, particularly, wavefront aberration, in a state that the projection lens is mounted in an exposure apparatus, that is, a state that it is actually used for exposure.

An example which may meet such a requirement is a phase restoration method. The phase restoration method has been used mainly for resolution improvement in an electron microscope or an astronomical telescope, for example, having large aberration. In this method, a phase distribution of an image is detected on the basis of image intensity distributions at plural positions such as an image plane, a pupil plane, and a defocus position, for example. From the phase distribution, wavefront aberration of the optical system can be calculated.

FIG. 5 illustrates an ordinary algorithm of the phase restoration method. Initially, by using an intensity distribution of light upon an image plane measured, an arbitrary phase is given. Thereafter, through Fourier transform, a complex amplitude distribution upon a pupil plane is detected. Then, while a phase portion of the thus given complex amplitude distribution is kept as it is, only an absolute value of an intensity portion is replaced by a value corresponding to an actually measured value (i.e., a square root of the intensity on the pupil plane). The resultant is taken as a complex amplitude distribution. The thus determined complex amplitude distribution is inversely Fourier transformed, whereby a complex amplitude distribution upon an image plane is determined. Again, while keeping its phase portion, the intensity is replaced by an actually measured value.

The above-described calculation is repeated, by which complex amplitude distributions on the image plane and the pupil plane are calculated. From the phase distribution of the complex amplitude distribution on the pupil plane, wavefront aberration of the lens can be obtained.

If measurement of an intensity distribution on a pupil plane is difficult to accomplish, as in the case of a photolithographic projection optical system, the transform and the inverse transform may be repeated between an image plane and a defocus plane and through a pupil plane such as shown in FIG. 6, to calculate complex amplitude distributions on the image plane and the defocused plane, respectively, and, from the results, the phase distribution on the pupil, that is, the wavefront aberration of the projection lens may be determined (see J.J.A.P. Vol. 36, 1997, pp. 7494–7498, or Japanese Laid-Open Patent Application, Laid-Open No. 284368/1998).

FIG. 7 illustrates an exposure apparatus having a mechanism for calculating the wavefront aberration of a projection lens 71 in accordance with the phase restoration method. In this apparatus, a pattern of a reticle 72 is illuminated with an illumination light flux IL, and an image thereof is imaged on a light intensity detecting system 78, by which the intensity distribution of the light is measured. Subsequently, a stage 74 is moved in an optical axis AX direction by means of a stage driving system 75, such that the pattern of the reticle 72 is placed defocused upon the light intensity detecting system 78. Then, the intensity distribution in this state is measured.

By using the results of these two intensity distributions, Fourier transform and inverse transform are repeated in a data processing system 81, by which wavefront aberration of the projection lens 71 is calculated.

the major factor which determines the precision in calculation of wavefront aberration based on the phase restoration method described above is how to accurately measure a light intensity distribution upon an image plane, a pupil plane or a defocus plane.

On the other hand, in a projection lens of a semiconductor exposure apparatus, the produced aberration is inherently very small. This raises a problem that, if the wavefront aberration of the projection lens is calculated on the basis of the phase restoration method, since a calculation error resulting from an error in the measurement of intensity distribution, for example, is relatively large as compared with the amount of wavefront aberration to be detected, accurate calculation of the wavefront aberration is not attainable as a consequence.

Further, as described above, due to increasing miniaturization of an exposure pattern, the influence of aberration of a projection lens becomes large. Therefore, the need for accurate detection of the wavefront aberration is increasing.

Moreover, in conventional exposure apparatuses, for measurement of a light intensity distribution, a light intensity detector such as at 78 in FIG. 7 is provided on a stage 74. This means that a heavy weight is mounted on the stage 74 which is driven at high speed. As a result, the stage design becomes more difficult, and the stage driving speed has to be decreased, causing reduction of throughput.

Particularly, when an enlargement optical system is used for more precise measurement of the intensity distribution, such as shown in FIG. 8, an enlargement optical system 80 has to be mounted on the stage 74. This makes the weight problem more critical.

SUMMARY OF THE INVENTION

It is an object of the present invention to provide a unique and improved arrangement for an exposure apparatus by which at least one of the problems described above can be solved or reduced.

In accordance with a first aspect of the present invention, there is provided an exposure apparatus wherein a wavefront aberration of a projection optical system is detected on the basis of a light intensity distribution of an image of a mask, formed by light passed through the projection optical system plural times.

In accordance with a second aspect of the present invention, there is provided an exposure apparatus for forming an image of a circuit pattern on a photosensitive substrate, placed on a stage, through a projection optical system, wherein the stage includes a reflecting portion, and wherein a wavefront aberration of the projection optical system is detected on the basis of a light intensity distribution of an image of a mask, formed by light passed through the projection optical system, reflected by the reflecting portion, and then passed again through the projection optical system.

More specifically, light from an image of a mask being formed with light which has been emitted from a light source, then passed through the mask, then entered into a projection optical system, then emitted from the projection optical system, then reflected by a reflective member or a reflecting portion of a stage, and then passed again through the projection optical system, may be directed to measuring means for measuring the light intensity distribution of the image of the mask. Then, a wavefront aberration of the projection optical system may be determined on the basis of a light intensity distribution of the image of the mask at the imaging position or a defocus position and in accordance with the phase restoration method.

The reflecting portion of the stage may be formed with a flat reflection surface, and the flat reflection surface may desirably be placed at a level substantially the same as that of a photosensitive substrate placed on the stage.

The reflecting portion may be formed with a spherical reflection surface, and a curvature center of the spherical reflection surface may desirably be placed at a level substantially the same as that of the photosensitive substrate placed on the stage.

In accordance with a projection apparatus or an exposure apparatus as described above, measurement can be done with a twice sensitivity to symmetrical aberration such as spherical aberration or astigmatism aberration, among components of wavefront aberration of the projection optical system. As a result, the wavefront aberration can be calculated very accurately.

Particularly, the wavefront aberration of a projection optical system, as being mounted on a major assembly of an exposure apparatus, can be adjusted very precisely. Additionally, when a reflecting portion having a spherical reflection surface is provided, asymmetrical components of the wavefront aberration as being represented by a coma aberration, can also be measured at least at twice sensitivity. Thus, the wavefront aberration can be calculated more exactly.

In accordance with the second aspect of the present invention described above, the stage should have a flat reflecting portion or a spherical reflecting portion only. There is no necessity of mounting an enlargement optical system or measuring means such as a light intensity detecting system upon the stage. Thus, the intensity distribution can be measured without a decrease of the stage driving speed.

On the basis of the wavefront aberration thus calculated as described above, the wavefront aberration of the projection optical system may be adjusted before a start of exposure. This accomplishes an exposure process less influenced by the aberration.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a schematic view of an exposure apparatus according to a second embodiment of the present invention.

DESCRIPTION OF THE PREFERRED EMBODIMENTS

First Embodiment

Figure 1:
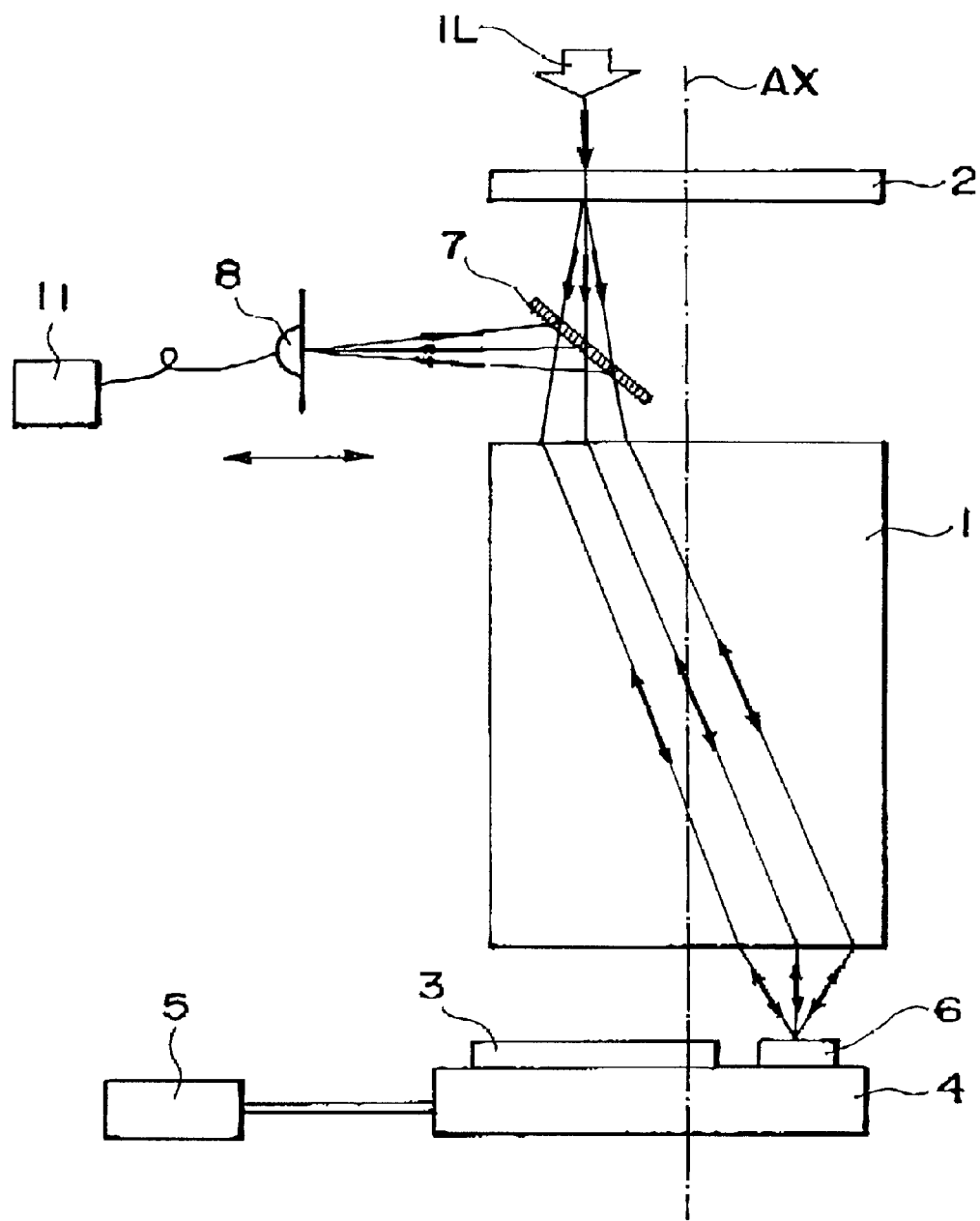
FIG. 1 is a schematic view of an exposure apparatus according to a first embodiment of the present invention.

FIG. 1 shows a schematic view of an exposure apparatus (including a projection system) according to a first embodiment of the present invention. Major differences thereof to the exposure apparatus of FIG. 7 having a conventional wavefront calculating mechanism based on a phase restoration method, reside in that a flat mirror 8 is provided on a wafer stage 4 at the same level as an exposure surface of a wafer (photosensitive substrate) 3, and that a half mirror 7 is disposed between a reticle 2 and a projection lens 1 while a light intensity detecting system (measuring means) 8 is disposed on the reticle side (which is disposed on the wafer side, in the conventional structure). The wafer 3 is coated with a resist material and, after execution of exposure with a device (circuit) pattern, it is processed by a development process.

Denoted in FIG. 1 at 5 is a stage driving system for moving the wafer stage 4. Denoted at 11 is a data processing system for calculating the wavefront aberration of the projection lens 7 on the basis of the results of two light intensity distributions, to be described later.

In this exposure apparatus, a light source (not shown) emits an illumination light flux IL of an exposure wavelength. A light flux, of the illumination light flux IL, passing through a pattern of the reticle 2 forms a pattern image (mask image). This light then passes through the half mirror 7 and enters the projection lens 1, and it is imaged on a flat mirror 6 by which the light is reflected. The reflected light passes again through the projection lens 1 and is reflected by the half mirror 7, whereby it is imaged on the light intensity detector 8. An intensity distribution A of the light at that moment (i.e., the intensity distribution upon a focus plane) is measured by the light intensity detecting system 8.

Subsequently, the position of the light intensity detector 8 is shifted so that the image of the pattern of the reticle 2 is placed defocused upon the light intensity detector 8. Then, a light intensity distribution B of the light in this state (i.e., the light intensity distribution upon a defocus plane) is measured.

Figure 6:
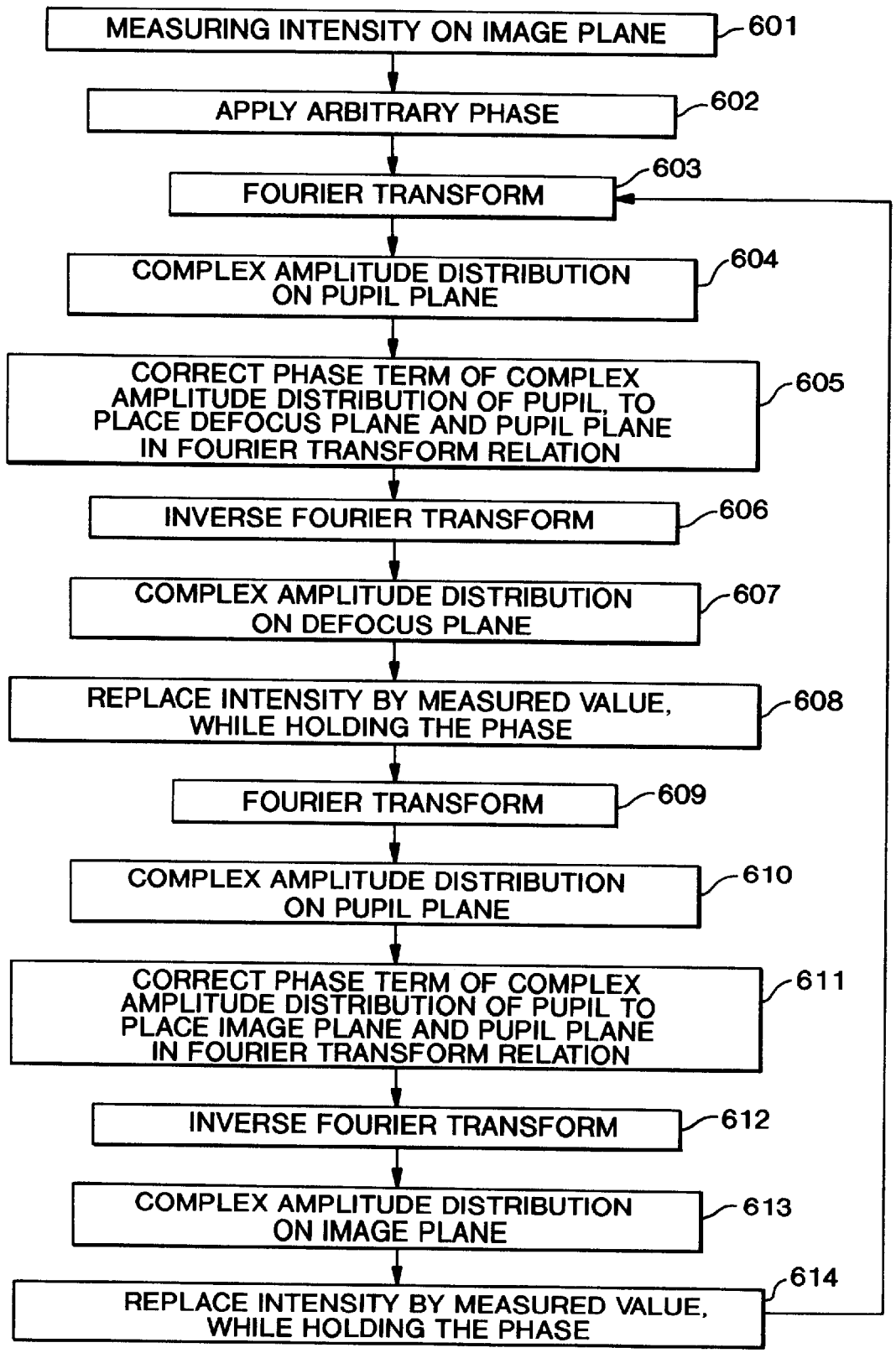
FIG. 6 illustrates a phase restoration method in a case wherein an intensity distribution at a defocus plane is used.

By using the thus obtained intensity distributions A and B and in accordance with the flow chart such as shown in FIG. 6, the wavefront aberration of the projection lens 1 is calculated on the basis of the phase restoration method. More specifically, an arbitrary phase is applied to the intensity distribution A and, through Fourier transform, a complex amplitude distribution upon a pupil plane is detected. Then, correction is made to a phase portion of the complex amplitude distribution on the pupil plane so that the pupil plane and the defocus plane (where the intensity distribution B has been measured) are placed in a Fourier transform relation (image and pupil relation). Thereafter, a complex amplitude distribution thereof is inversely Fourier transformed and, now, a complex amplitude distribution upon the defocus plane is detected.

Subsequently, of the complex amplitude distribution on the defocus plane, while the term of the phase is kept unchanged, only the absolute value corresponding to the term of the intensity is replaced by a value based on an actually measured value of the intensity on the defocus plane. Then, through Fourier transform, a complex amplitude on the pupil is determined.

After this, correction is made to the phase portion of the complex amplitude distribution at the pupil plane so that the pupil plane and the focus plane are placed again into a Fourier transform relation. Then an inverse transform is made and a complex amplitude distribution on the focus plane is calculated. Here, again, only the term for intensity is changed on the basis of an actually measured value, and a Fourier transform is performed.

Through repetition of the above-described procedure, a complex amplitude distribution at the imaging position is calculated. By making a Fourier transform to that distribution, a phase distribution upon the pupil plane, that is, wavefront aberration of the projection lens, can be calculated.

Figure 7:
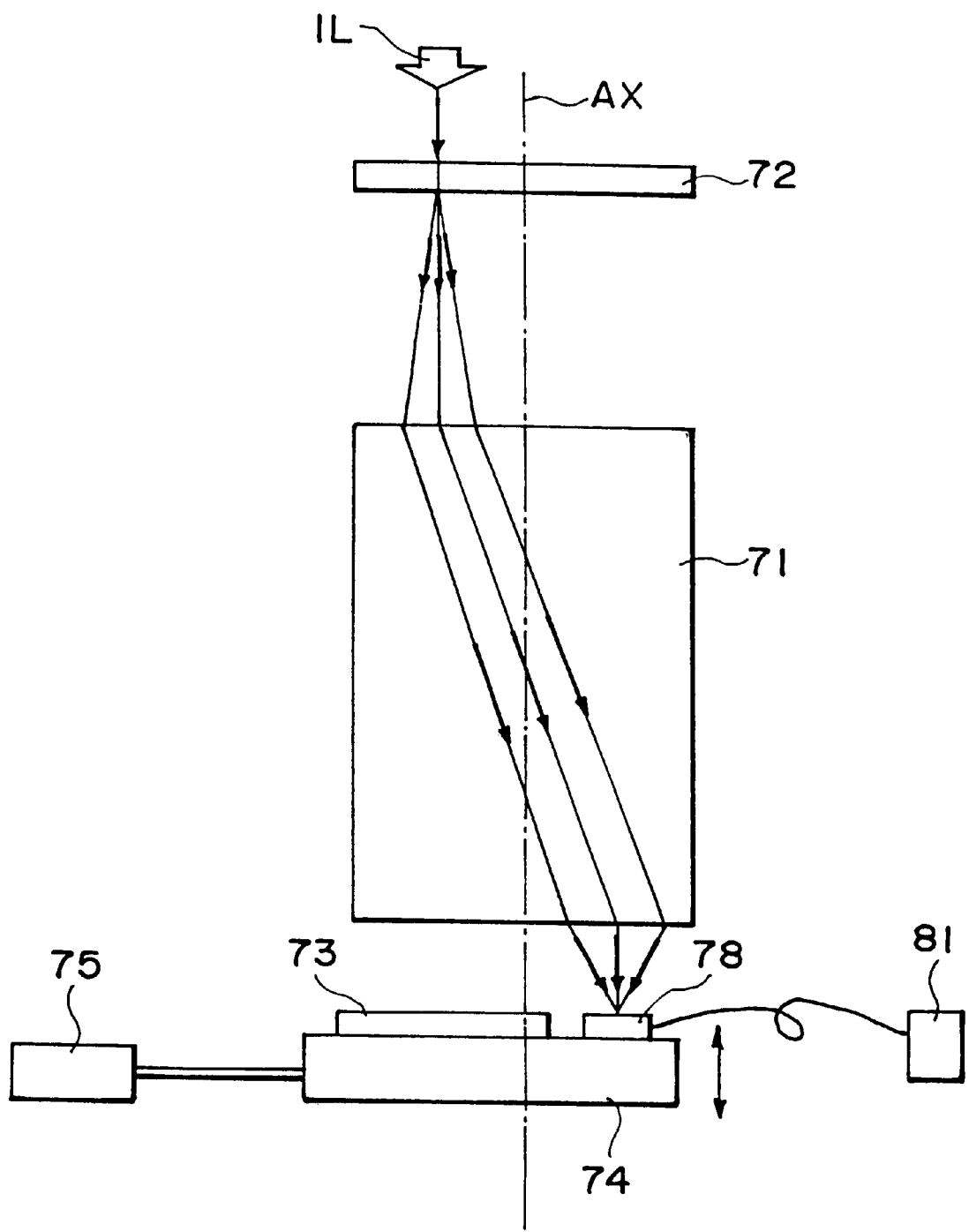
FIG. 7 is a schematic view of a conventional exposure apparatus.

Here, in this embodiment, by means of the provision of the flat mirror 6, the image of the pattern of the reticle 2 is caused to pass through the projection lens 2 twice and it is imaged on the light intensity detector 8. Therefore, the sensitivity only to symmetrical components such as spherical aberration or astigmatism, among the components of wavefront aberration, becomes twice higher as compared with the conventional arrangement such as shown in FIG. 7.

The reason for the twice sensitivity only to the symmetrical components is that the light passing through the projection lens 1 in its forward stroke (directed from the reticle side to the wafer side) and the light in its backward stroke (directed from the wafer side to the reticle side) are revolutionally symmetrical with respect to the chief ray, such that asymmetrical components are cancelled.

In this embodiment, as described above, the flat mirror 6 is provided on the stage 4 and the light intensity distribution of a pattern image as formed by light passing through the projection lens 1 twice is measured by means of the light intensity detecting system 8. As a result of this, the sensitivity to a symmetrical component of the wavefront aberration can be enlarged twice. Therefore, as compared with the conventional method, the wavefront aberration can be calculated exactly.

Further, since there is no necessity of providing a light intensity detecting system upon the stage, the intensity distribution can be measured without slowing down the stage driving speed.

Second Embodiment

FIG. 2 shows an exposure apparatus (including a projection system) according to a second embodiment of the present invention. In FIG. 2, components corresponding to those of the first embodiment are denoted by the same reference numerals as in the first embodiment.

The first embodiment concerns a case wherein the flat mirror 6 is mounted on the wafer stage 4. In the second embodiment, on the other hand, a spherical mirror 9 is formed integrally on a wafer stage or it is integrally incorporated into the stage.

Here, the spherical mirror 9 has a curvature center which is placed at the same level (height) as the surface of the wafer 3 to be exposed. With this arrangement, the light passing through the projection lens 1 in its forward stroke (directed from the reticle side to the wafer side) and the light in its backward stroke (directed from the wafer side to the reticle side) pass at the same position. As a result, the sensitivity in with respect to all the components of the wavefront aberration, including asymmetrical components being represented by a coma aberration, can be enlarged twice as compared with the conventional structure shown in FIG. 7. Therefore, more accurate calculation of the wavefront aberration, as compared with the first embodiment, is attainable with this embodiment.

Also, in this embodiment, like the first embodiment, there is no necessity of mounting a light intensity detecting system upon the stage 14. Therefore, the intensity distribution measurement can be done without slowing down the stage 14 driving speed.

While, in this embodiment, the spherical mirror 9 comprises a concave surface mirror, it may be replaced by a convex surface mirror having its curvature center placed at the same level as the wafer surface to be exposed.

Third Embodiment

Figure 3:
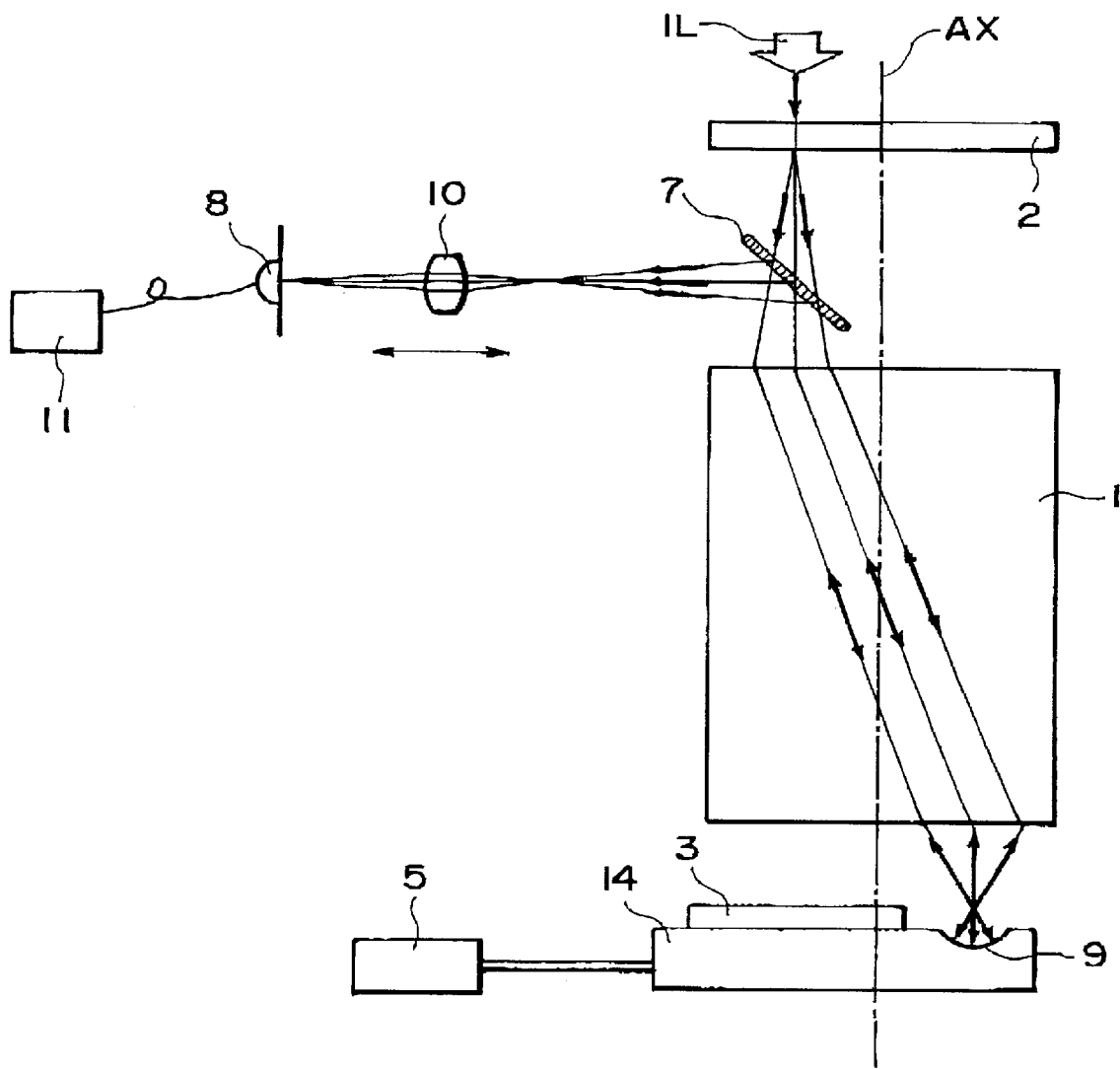
FIG. 3 is a schematic view of an exposure apparatus according to a third embodiment of the present invention.

FIG. 3 shows an exposure apparatus (including a projection system) according to a third embodiment of the present invention. This embodiment is a modified form of the second embodiment, and, in FIG. 3, components corresponding to those of the second embodiment are denoted by the same reference numerals as in the second embodiment.

This embodiment corresponds to a modification of the second embodiment, and an enlargement optical system 10 is disposed between the light intensity detecting system 8 and the half mirror 7. By this enlargement optical system 10, an image of the reticle 2 pattern at an imaging position as well as the image thereof at a defocused position are magnified, and they are imaged upon the detecting system 8 in enlargement.

Figure 8:
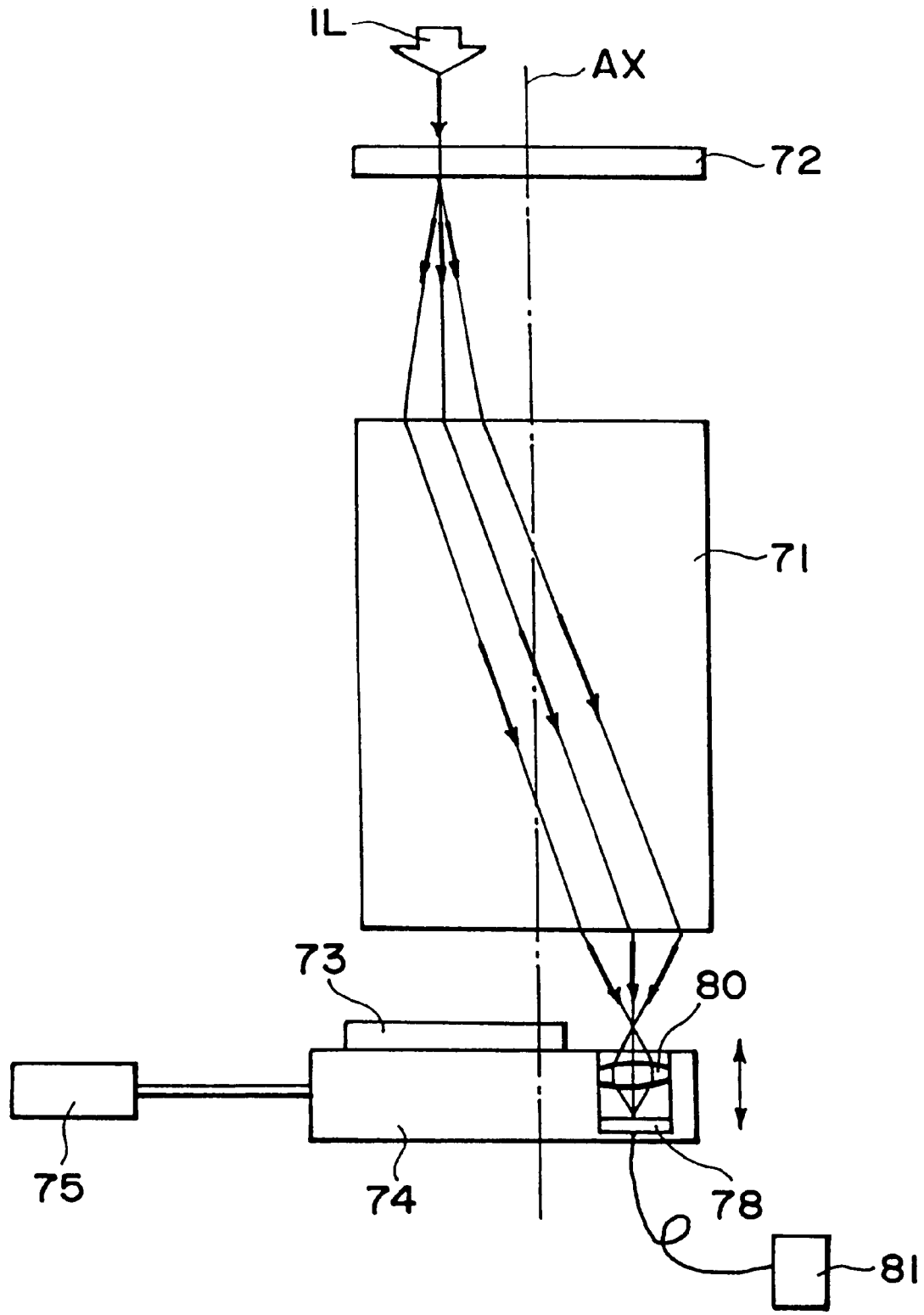
FIG. 8 is a schematic view of a conventional exposure apparatus having an enlargement optical system.

This enables more precise measurement of the intensity distribution upon the image plane and the intensity distribution at the defocus position, necessary for the phase restoration method. Thus, the wavefront aberration calculation precision can be improved significantly. Also, as compared with the structure of FIG. 8 having an enlargement optical system, there is no necessity of disposing the enlargement optical system upon the stage. Therefore, precise measurement of the intensity distribution can be accomplished without slowing down the stage moving speed.

It is to be noted that, in the structure of the first embodiment, an enlargement optical system 10 may be provided between the light intensity detector 8 and the half mirror 7, as in this embodiment.

Fourth Embodiment

Figure 4:
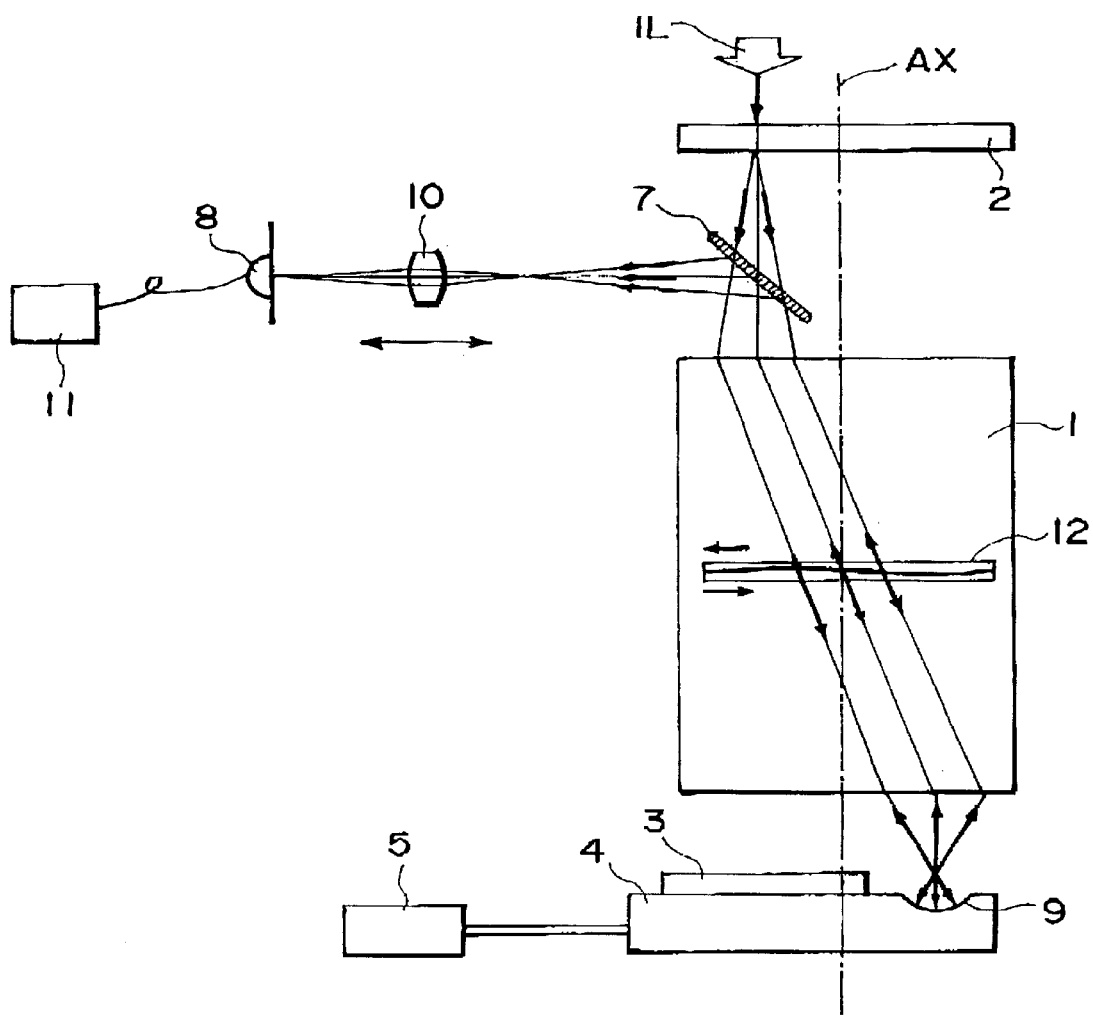
FIG. 4 is a schematic view of an exposure apparatus according to a fourth embodiment of the present invention.
Figure 5:
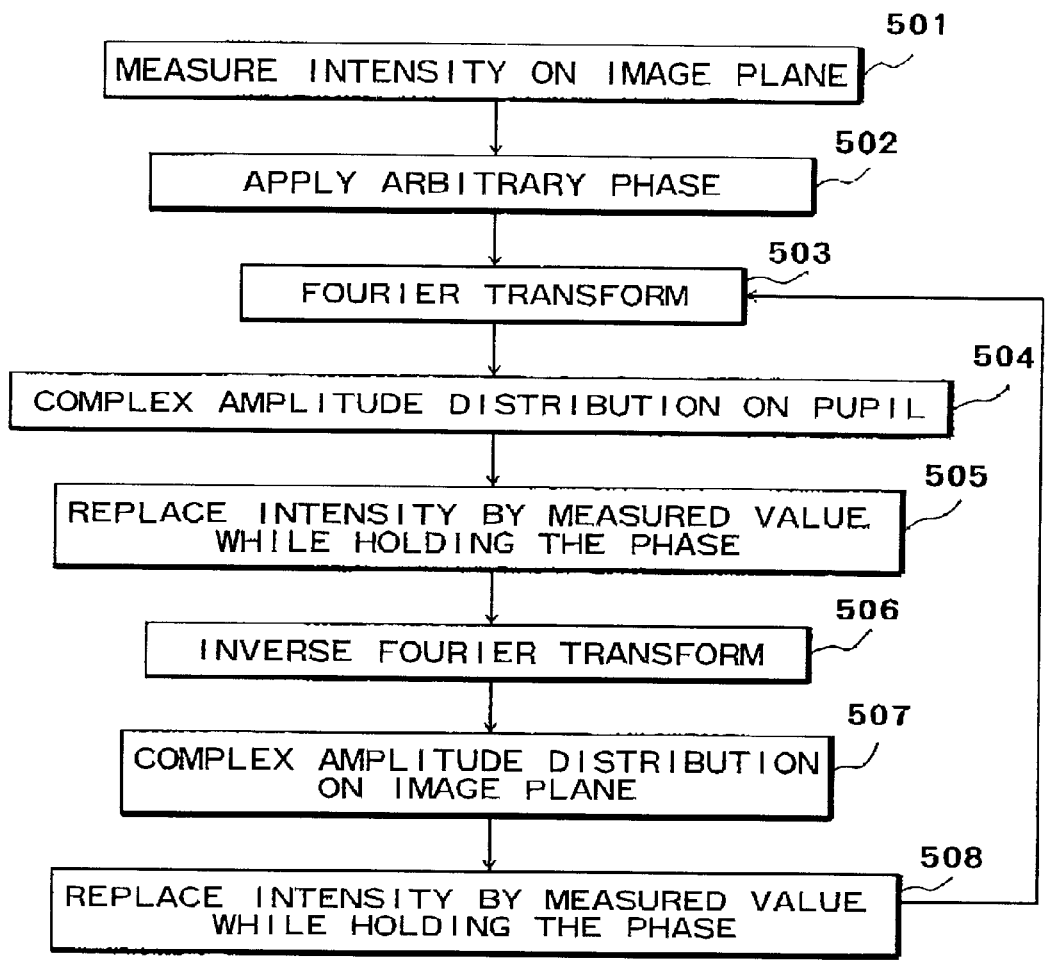
FIG. 5 illustrates an algorithm of a phase restoration method.

FIG. 4 shows an exposure apparatus (including a projection system) according to a fourth embodiment of the present invention. This embodiment is a modified form of the third embodiment, and, in FIG. 4, components corresponding to those of the third embodiment are denoted by the same reference numerals as in the third embodiment.

With the arrangement of the third embodiment, as compared with the conventional structure, use of the mirror 9 makes it possible to calculate the wavefront aberration of the projection lens 1 at a twice sensitivity as compared with the conventional method. In this embodiment, in consideration of it, an aberration correcting optical system (aberration adjusting means) 12 is provided inside the projection lens 1 by which the aberration of the projection lens 1 is corrected or an air spacing or spacings, for example, between lenses of the projection lens is adjusted, in accordance with the result of the wavefront aberration calculation.

Here, the aberration correcting optical system 12 may comprise an optical device having a pair of aspherical surface optical elements of the same shape, having their aspherical surfaces disposed opposed to each other, such as proposed in Japanese Laid-Open Patent Application, Laid-Open No. 242048/1998.

With the structure according to this embodiment, a wafer 3 can be exposed under a state of reduced aberration. Particularly, since the aberration measurement can be done with a twice sensitivity as compared with the conventional structure, the projection lens 1 can be adjusted with its aberration being controlled more precisely.

While in this embodiment the aberration correction optical system 12 is disposed adjacent to a pupil plane of the projection lens 1, it may be placed between the projection lens 1 and the wafer 3 or between the projection lens 1 and the reticle 2. Alternatively, plural elements may be disposed there.

Further, in the first and second embodiments, an aberration correction optical system such as that of the fourth embodiment, may be provided.

While the present embodiment has been described with reference to an example wherein a pair of aspherical surface optical elements are used as the aberration correction optical system, the aberration adjusting means is not limited to it. For example, a structure in which plural lenses of the projection lens are moved for aberration correction, may be used. As an alternative, one or two or more parallel flat plates may be disposed between the projection lens and the wafer or between the projection lens and the reticle, and the angle or angles of these parallel flat plates may be changed.

In the embodiments described above, the wavefront aberration of the projection lens is calculated on the basis of the focus plane (image plane) and one defocus plane. However, the wavefront aberration of the projection lens 1 may be calculated without using the focus plane (image plane), but, rather, it may be calculated on the basis of intensity distributions upon two different defocus planes. Also, the wavefront aberration may be calculated on the basis of the focus plane (image plane) and plural defocus planes, namely, on the basis of intensity distributions at three or more positions.

In the embodiments described above, the present invention has been explained with reference to an exposure apparatus. However, the present invention is not limited to an exposure apparatus, but it may be applied to aberration calculation for a projection optical system in various projection systems. Further, the present invention is applicable not only to calculation of wavefront aberration of a projection optical system, but also to calculation of various optical information, for example.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

a stage on which a substrate to be exposed is provided;

a projection optical system for projecting a pattern onto the substrate; and an aberration detection system for forming an image of a pattern of a mask formed by light passed through the projection optical system plural times, for detecting an intensity distribution of the image of the pattern of the mask, and for detecting a wavefront aberration of the projection optical system on the basis of the detected intensity distribution.

2. An apparatus according to claim 1, wherein said aberration detection system detects the wavefront aberration of the projection optical system on the basis of a light intensity distribution of an image of the mask, formed by light passed reciprocatively through the projection optical system.

3. An apparatus according to claim 2, further comprising a reflective member for reflecting light, passed through the projection optical system, so that the light passes again through the projection optical system to thereby form an image of the mask.

4. An apparatus according to claim 3, further comprising light guiding means and measuring means, said light guiding means causing light, passed through the mask, to enter the projection optical system and directing light, emitted from the projection optical system and reflected by the reflective member and then passed again through the projection optical system, to said measuring means, which measures a light intensity distribution of the image of the mask.

5. An apparatus according to any one of claims 1–4, further comprising an enlargement optical system disposed on a light path to said measuring means for measuring a light intensity distribution of the image of the mask.

6. An apparatus according to any one of claims 1–4, wherein said aberration detection system detects the wavefront aberration of the projection optical system on the basis of a light intensity distribution of an image of the mask at its imaging position and a light intensity distribution at at least one defocus position, or light intensity distributions at plural defocus positions, and in accordance with a phase restoration method.

7. An apparatus according to any one of claims 1–4, further comprising aberration adjusting means for adjusting aberration of the projection optical system on the basis of the detected wavefront aberration.

8. An exposure apparatus comprising:

a stage on which a substrate to be exposed is provided, said stage having a reflecting portion;

a projection optical system for projecting a circuit pattern onto the substrate; and an image pickup device for detecting an intensity distribution of an image of a pattern of the mask, formed by light passed through the projection optical system, reflected by the reflecting portion of the stage, and then passed again through the projection optical system, wherein a wavefront aberration of the projection optical system is detected on the basis of the detected intensity distribution.

9. An apparatus according to claim 8, wherein the reflecting portion has a flat reflection surface, which is placed at a level substantially the same as that of the photosensitive substrate placed on the stage.

10. An apparatus according to claim 8, wherein the reflecting portion has a spherical reflection surface, and a curvature center of the spherical reflection surface, is placed at a level substantially the same as that of the photosensitive substrate placed on the stage.

11. An apparatus according to any one of claims 8–10, further comprising light guiding means and measuring means, said light guiding means causing light, passed through the mask, to enter the projection optical system and directing light, emitted from the projection optical system and reflected by the reflecting portion and then passed again through the projection optical system, to said measuring means, which measures a light intensity distribution of the image of the mask.

12. An apparatus according to any one of claims 8–10, further comprising an enlargement optical system disposed on a light path to said measuring means for measuring a light intensity distribution of the image of the mask.

13. An apparatus according to any one of claims 8–10, wherein the wavefront aberration of the projection optical system is detected on the basis of a light intensity distribution of an image of the mask at its imaging position and a light intensity distribution at least one defocus position, or light intensity distributions at plural defocus positions, and in accordance with a phase restoration method.

14. An apparatus according to any one of claims 8–10, further comprising aberration adjusting means for adjusting aberration of the projection optical system on the basis of the detected wavefront aberration.

15. An apparatus according to any one of claims 8–10, wherein the image of the mask is a projected image of a pattern formed on one of a reticle and a photomask.

16. A device manufacturing method, comprising the steps of:

exposing a wafer with a device pattern by use of an exposure apparatus as recited in any one of claims 1–4 or 8–10; and developing the exposed wafer.

* * * * *

UNITED STATES PATENT AND TRADEMARK OFFICE
CERTIFICATE OF CORRECTION

PATENT NO.    : 6,278,514 B1
DATED         : August 21, 2001
INVENTOR(S)   : Yoshinori Ohsaki It is certified that error appears in the above-identified patent and that said Letters Patent is hereby corrected as shown below:

Column 5,
Line 54, "such" should read -- so --.

Column 6,
Line 22, "in" should be deleted.

Column 9,
Line 12, "surface," should read -- surface --.

Column 10,
Line 7, "at" should read -- at at --.

Signed and Sealed this

Ninth Day of April, 2002

*Attest:*

*Attesting Officer*

JAMES E. ROGAN
*Director of the United States Patent and Trademark Office*